(12) United States Patent
Kim

(10) Patent No.: US 7,567,450 B2
(45) Date of Patent: Jul. 28, 2009

(54) LOW POWER ROM

(75) Inventor: Byung Ryul Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 127 days.

(21) Appl. No.: 11/618,493

(22) Filed: Dec. 29, 2006

(65) Prior Publication Data

US 2007/0263463 A1 Nov. 15, 2007

(30) Foreign Application Priority Data

May 12, 2006 (KR) ...................... 10-2006-0042994

(51) Int. Cl.
*G11C 17/00* (2006.01)
*G11C 5/14* (2006.01)
*G11C 7/02* (2006.01)

(52) U.S. Cl. .................. 365/104; 365/189.09; 365/203; 365/210.1; 365/210.12

(58) Field of Classification Search .................. 365/94, 365/104, 189.07, 189.09, 210.1, 230.03
See application file for complete search history.

(56) References Cited

U.S. PATENT DOCUMENTS

| | | | |
|---|---|---|---|
| 4,675,845 A * | 6/1987 | Itoh et al. ..................... 365/51 |
| 4,764,693 A | 8/1988 | Iwata | |
| 5,163,021 A * | 11/1992 | Mehrotra et al. ....... 365/185.03 |
| 5,258,958 A * | 11/1993 | Iwahashi et al. ....... 365/185.21 |
| 5,299,165 A * | 3/1994 | Kimura et al. .............. 365/207 |
| 6,442,081 B1 | 8/2002 | Nagashima | |
| 6,504,778 B1 * | 1/2003 | Uekubo .................. 365/189.15 |
| 2002/0186593 A1 * | 12/2002 | Takano et al. .......... 365/185.21 |
| 2006/0083091 A1 * | 4/2006 | Edahiro ...................... 365/203 |

FOREIGN PATENT DOCUMENTS

| | | |
|---|---|---|
| JP | 2000-353394 | 12/2000 |
| KR | 100172387 B1 | 10/1998 |
| KR | 1020020052678 A | 7/2002 |
| KR | 20050118207 | 12/2005 |

* cited by examiner

*Primary Examiner*—Ly D Pham
(74) *Attorney, Agent, or Firm*—Townsend and Townsend and Crew LLP

(57) ABSTRACT

A low power ROM includes a plurality of ROM core groups coupled between a plurality of word lines and bit lines, a word line decoder for selecting a desired word line of the plurality of word lines, a column decoder for selecting a desired bit line of the plurality of bit lines, a common reference voltage generator for generating a common reference voltage, and a plurality of sense amplifiers having the same number as the number of ROM core groups, for comparing an output of the common reference voltage generator and data of a bit line of each ROM core group.

11 Claims, 5 Drawing Sheets

LOW POWER ROM

BACKGROUND

The present invention relates to a Read Only Memory (ROM), and more particularly, to a ROM that operates at low power.

In general, the ROM stores data permanently once programmed. The ROM is classified into two types, a ROM having a NOR core cell or a ROM having a NAND core cell. The NAND core cell is advantageous in storage of a large capacity of data and the NOR core cell is advantageous in fast access of data.

The components that require the highest amount of power in the ROM are the bit lines. Each bit line is coupled to a capacitor. Accordingly, charging and discharging the capacitors are repeated in each bit line. Current ROMs include many junction capacitors within a chip, which occupy a large area. More particularly, when the ROM operates at low power of about 1.8 V, there are many difficulties in sensing data accurately and transferring the sensed data to the chip.

FIG. 1 is a schematic block diagram of a conventional low power ROM. A ROM 10 includes a ROM core unit 20, a word line decoder 30, a column decoder 40, and capacitor control units C1 to Ci. The ROM core unit 20 includes ROM cores (not shown) and retains stored data. The word line decoder 30 is coupled to the ROM core unit 20 through word lines WL1 to WLk and transfers a word line select signal. The column decoder 40 is coupled to the ROM core unit 20 through bit lines and transfers a bit line select signal. The capacitor control units C1 to Ci are grouped with a plurality of ROM cores (not shown) and serve to read and output data.

FIG. 2 is a detailed circuit diagram of the low power ROM shown in FIG. 1. The ROM core unit 20 includes a plurality of ROM cores. The plurality of ROM cores include NMOS transistors A1 to Ak, B1 to Bk, ..., n1 to nk, which are coupled to the bit lines BL1 to BLn and the word lines WL1 to WLk, respectively. The ROM core unit 20 disconnects or connects nodes coupled between the NMOS transistors and the bit lines, so that data are stored.

It is assumed in FIG. 2 that all the nodes are coupled. Each of the capacitor control units C1 to Ci includes transistors P1 and N1 to N6, capacitors CCS, CH, and CI, and a comparator BF. Each of the capacitor control units C1 to Ci is coupled to the plurality of ROM cores coupled to the plurality of bit lines, thus forming groups CG1 to CGi. The capacitor CCS is used to distribute charge to all groups CG1 to CGi and the capacitors CH, CI are used for sensing.

In this case, when the number of groups is plural, the number of capacitors must also be plural and the connection lines corresponding to the groups are also required. The plurality of groups, capacitors and connection lines occupies a large area. Furthermore, since power capable of driving all the plurality of capacitors is required, power consumption is increased accordingly.

SUMMARY OF THE INVENTION

An embodiment of the present invention relates to a ROM, in which core groups making up the ROM share capacitors included in one group, thereby reducing power consumption and chip area.

A low power ROM according to a embodiment of the invention includes a plurality of ROM core groups coupled between a plurality of word lines and bit lines and formed in a ROM core unit; a word line decoder for selecting a desired word line of the plurality of word lines; a column decoder for selecting a desired bit line of the plurality of bit lines; a common reference voltage generator for generating a common reference voltage; and a plurality of sense amplifiers having the same number as the number of ROM core groups, for comparing an output of the common reference voltage generator and data from a bit line of a ROM core group.

In another embodiment, a ROM comprises a ROM core unit including a plurality of ROM core groups, each ROM core group including a plurality of transistors coupled to a plurality of word lines and one or more bit lines; a word line decoder to select a desired word line from the word lines; a column decoder to select a desired bit line from the bit lines; one or more charge units, each charge unit having a plurality of transistors that are coupled to one of dummy bit lines; a common reference voltage generator coupled to the dummy bit lines to generate a common reference voltage; and a plurality of sense amplifiers, each coupled to a corresponding ROM core group and the common reference voltage generator.

DETAILED DESCRIPTION OF EMBODIMENTS

The present invention will now be described in detail in connection with certain embodiments. A more complete appreciation of the invention and many of the attendant advantages thereof, will be readily apparent and become better understood by reference to the following detailed description when considered in conjunction with the accompanying drawings in which like reference symbols indicate the same or similar components.

Figure 1:
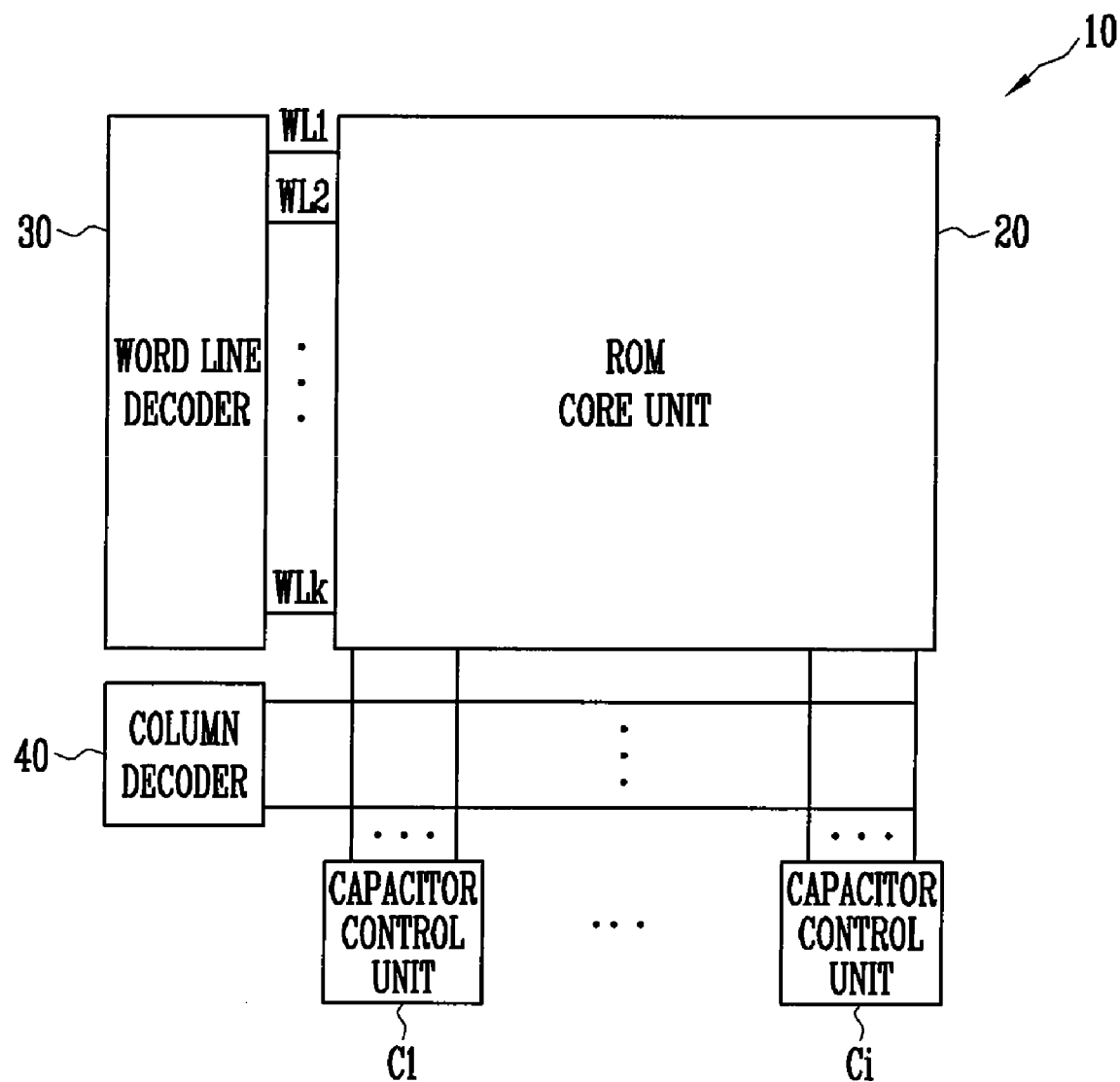
FIG. 1 is a schematic block diagram of a conventional low power ROM.
Figure 2:
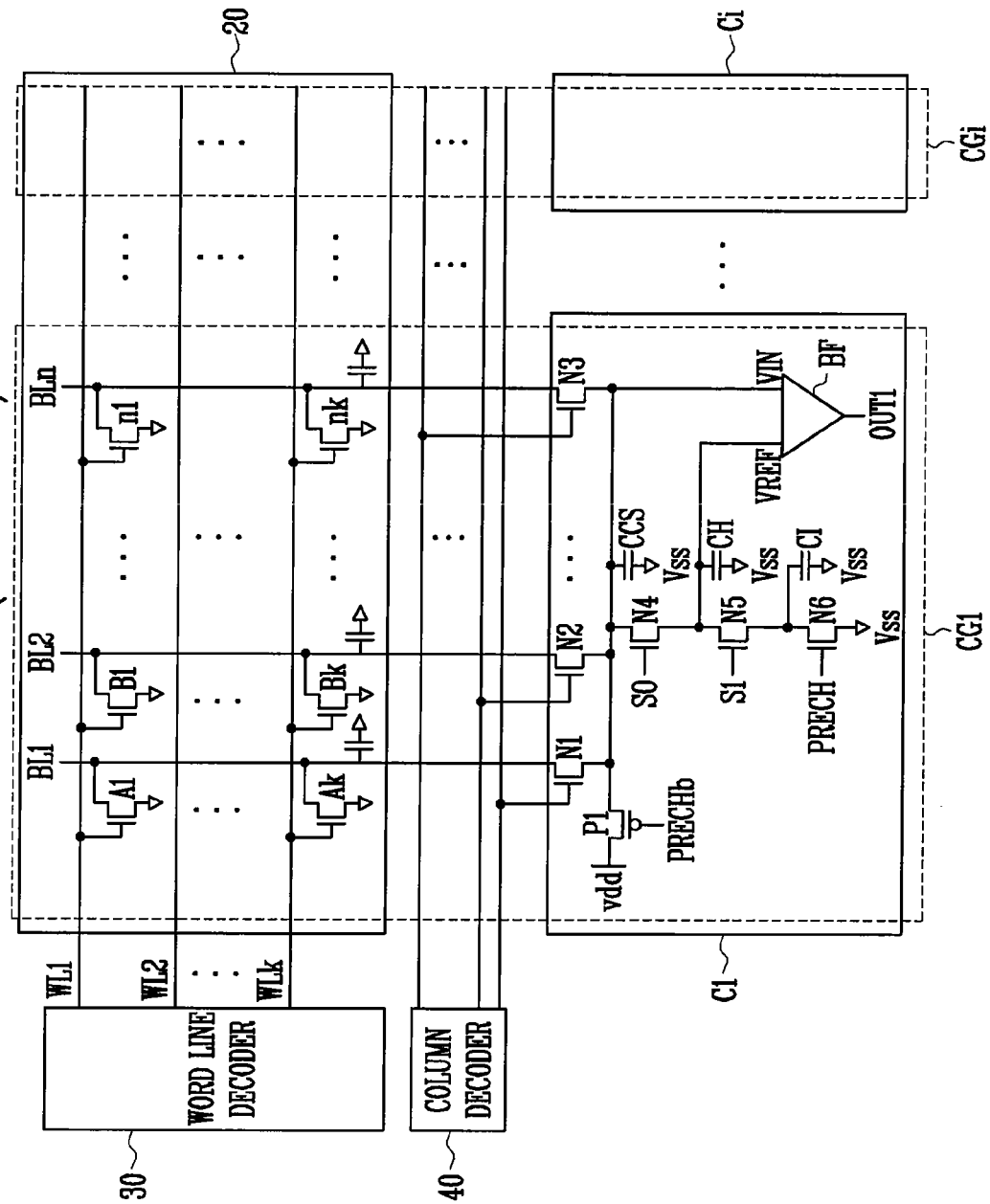
FIG. 2 is a detailed circuit diagram of the low power ROM shown in FIG. 1.
Figure 3:
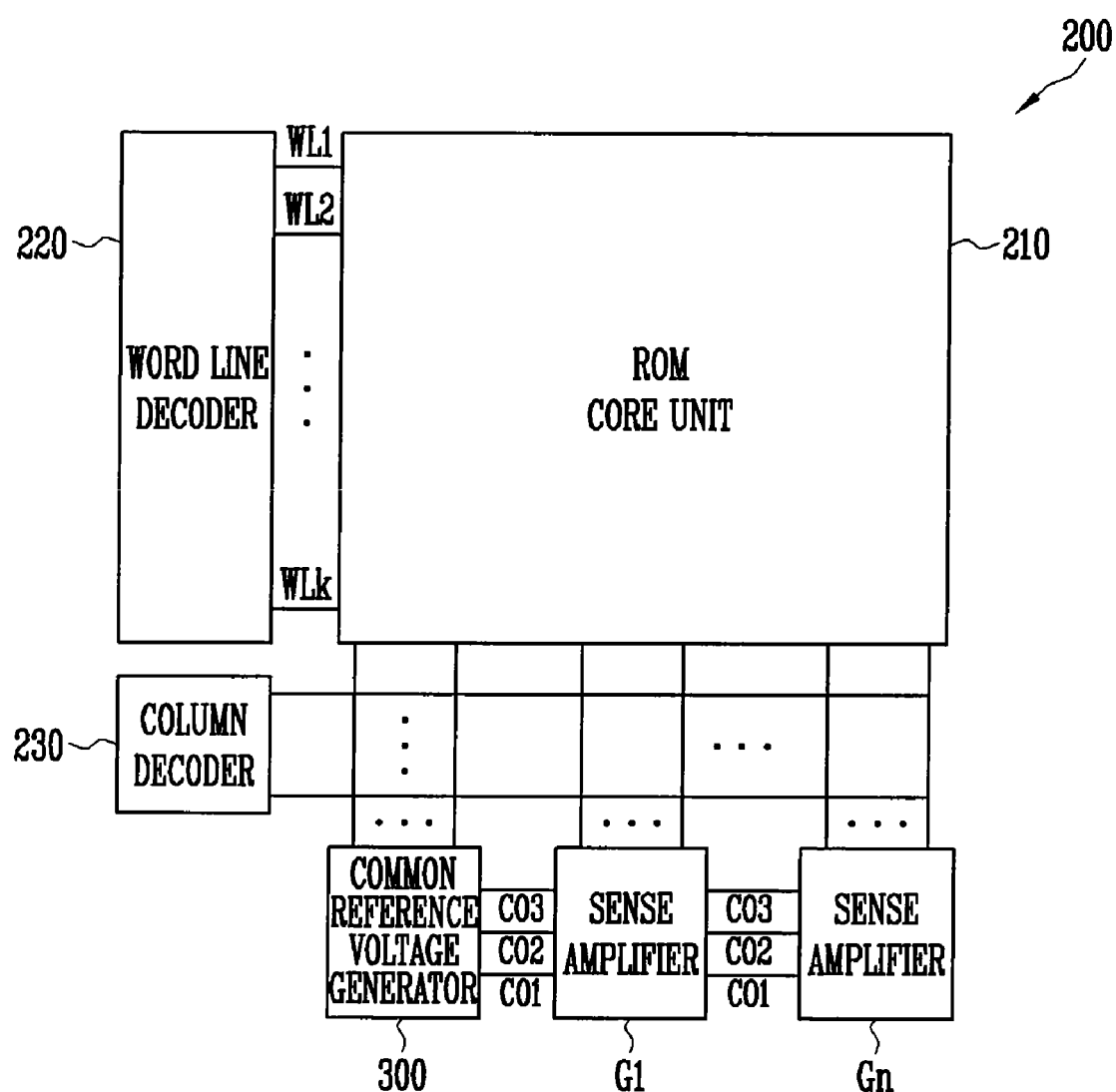
FIG. 3 is a schematic block diagram of a low power ROM according to an embodiment of the present invention.

FIG. 3 is a schematic block diagram of a low power ROM according to an embodiment of the present invention. The low power ROM 200 includes a ROM core unit 210, a word line decoder 220, a column decoder 230, a common reference voltage generator 300, and sense amplifiers G1 to Gn. The ROM core unit 210 stores data. The word line decoder 220 is coupled to the ROM core unit through word line WL1 to WLk and generates a word line select signal. The column decoder 230 generates a signal to select a bit line. The common reference voltage generator 300 is coupled to the ROM core unit 210 through dummy bit lines and generates a common reference voltage through common lines CO1 to CO3. Each of the sense amplifiers G1 to Gn is coupled to the ROM core unit 210 through the bit lines and is supplied with the common reference voltage from the common lines CO1 to CO3.

Figure 4:
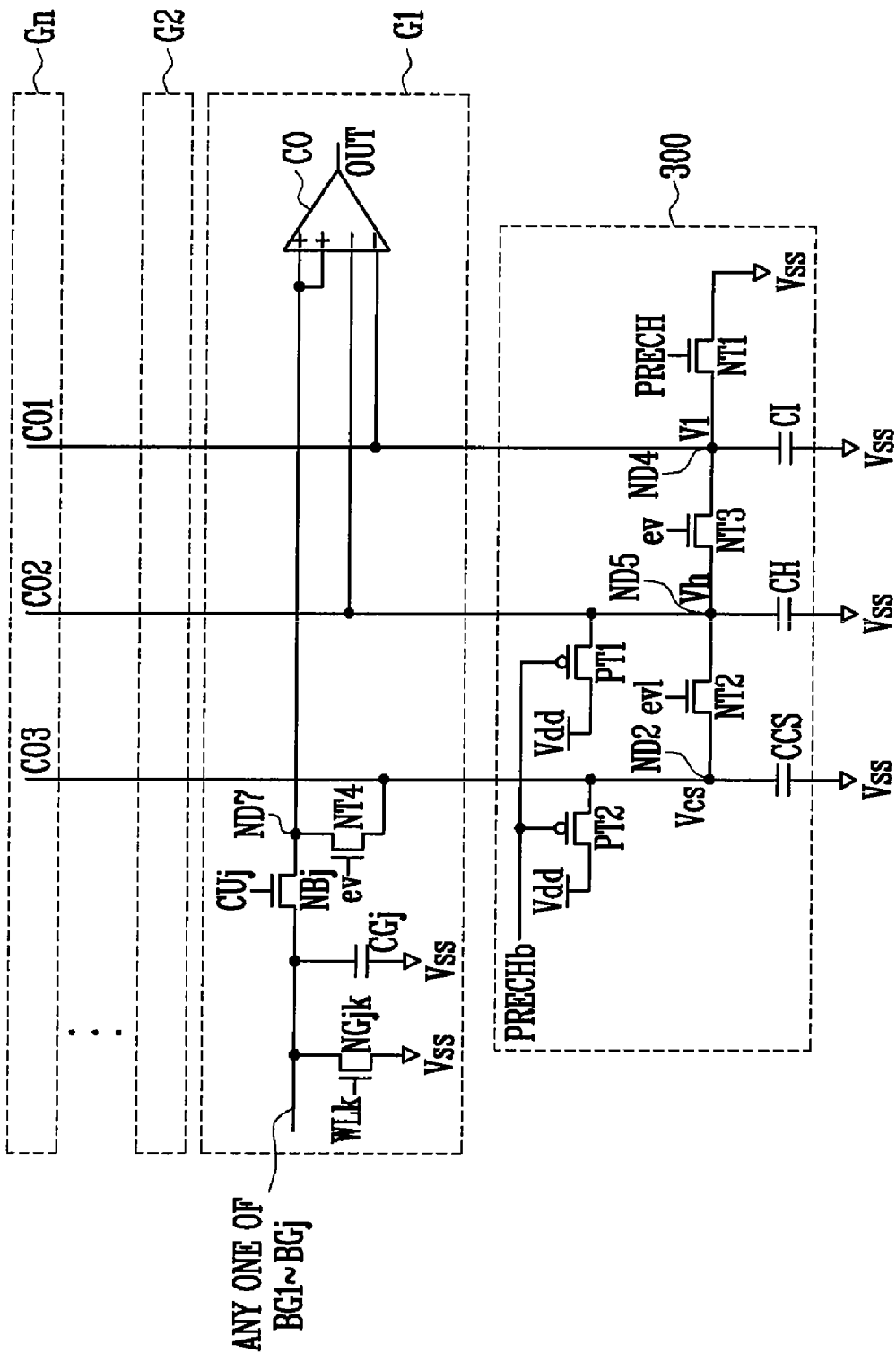
FIG. 4 is a circuit diagram schematically showing a common reference voltage generator of FIG. 3 and a connection relation thereof.

Referring to FIG. 4, the circuit diagram schematically shows the common reference voltage generator of FIG. 3 and the connection relation thereof. The common reference voltage generator 300 includes a plurality of precharge elements PT1, PT2, and NT1 and NMOS transistors NT2 and NT3. The precharge elements PT1 and PT2 include PMOS transistors and the precharge element NT1 includes an NMOS transistor.

The PMOS transistor PT1 precharges the common line CO2 by supplying a power supply voltage Vdd to the common line CO2 in response to an inverted precharge signal PRECHb. The PMOS transistor PT2 precharges the common line CO3 by supplying the power supply voltage Vdd to the common line CO3 in response to the inverted precharge signal PRECHb. The NMOS transistor NT1 is coupled between node ND4 and a ground voltage Vss and operates in response to a precharge signal PRECH. The NMOS transistor NT2 is coupled between node ND2 and node ND5 and operates in response to a signal ev1. The NMOS transistor NT3 is coupled between node ND5 and node ND4 and operates in response to a control signal ev.

The potential Vcs of the node ND2 and the potential Vh of the node N5 are pulled-up to the power supply voltage Vdd when the inverted precharge signal PRECHb of a low level (e.g., PRECHb=0) is applied to gates of the PMOS transistor PT2 and PT1. When the precharge signal PRECH becomes a high level (e.g., PRECH=1), the potential V1 of the node ND4 becomes 0 V since the NMOS transistor NT1 is turned on. At this time, the NMOS transistor NT2 is turned on in response to the signal ev1. If the NMOS transistor NT4 coupled to the bit line of a selected column is turned on, all charge units CCS, CH, and CGj are charged to the potential Vcs of the node ND2. The potential Vcs of the node ND2 is the same as the potential Vh of the node ND5. In this case, the bit lines of other groups G1 to Gn in the same column address are also charged to the potential Vcs.

For column evaluation the NMOS transistor NT2 is turned off and the NMOS transistor NT3 is turned on. The potentials of the nodes ND4 and ND5 become a half voltage Vcs/2 of the node ND2. The voltage becomes the common reference voltage Vref, thereby enabling sensing.

Figure 5:
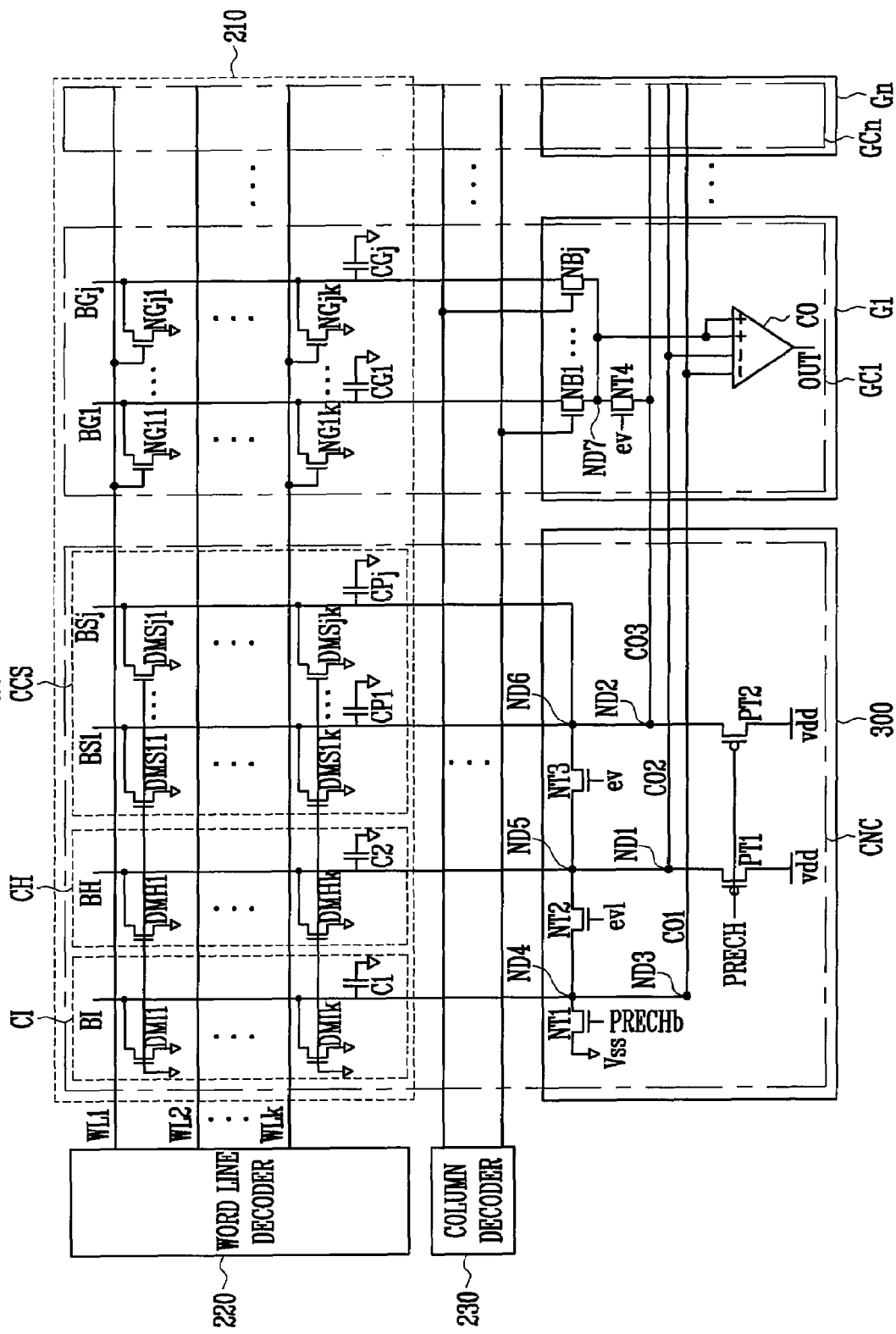
FIG. 5 is detailed circuit diagram of the low power ROM shown in FIG. 3.

FIG. 5 is detailed circuit diagram of the low power ROM shown in FIG. 3. The ROM core unit 210 includes a first charging unit CI, a second charging unit CH and a third charging unit CCS and a plurality of memory cells NG11 to NGjk. The first, second and third charging units CI, CH and CCS include a plurality of NMOS transistors DMI1 to DMIk, DMH1 to DMHk, and DMS11 to DMSjk. NMOS transistors DMI1 to DMIk coupled to a first dummy bit line BI serve as the first charge unit CI, NMOS transistors DMH1 to DMHk coupled to a second dummy bit line BH serve as the second charge unit CH, and NMOS transistors DMS11 to DMSjk coupled to dummy bit line units BS1 to BSj serve as the third charge unit CCS. The gate terminals of all the NMOS transistors DMI1 to DMIk, DMH1 to DMHk, and DMS11 to DMSjk coupled to the first to third charge units CI, CH, and CCS are coupled to the ground voltage Vss and are always turned off.

Each of the dummy bit lines BI, BH, and BS1 to BSj includes one or more capacitors C1, C2, and CP1 to CPj, and is charged with a voltage. Accordingly, the charge voltage of the first charge unit CI becomes the charge voltage of the first capacitor C1, and the charge voltage of the second charge unit CH is the same as the second capacitor C2. The charge voltage of the third charge unit CCS becomes the same as the voltage of one of the capacitors CP1 to CPj.

The common reference voltage generator 300 includes a plurality of transistors PT1 and PT2, and NT1 to NT3. The PMOS transistor PT1 is coupled between a node ND1 and a power supply voltage Vdd and operates in response to an inverted precharge signal PRECHb. The PMOS transistor PT2 is coupled between a node ND2 and a power supply voltage Vdd and operates in response to a precharge signal PRECH. The PMOS transistors PT1 and PT2 are driven to pull up the dummy bit lines BI, BH, and BS1 to BSj. The NMOS transistor NT1 is coupled between a node ND4 and a ground voltage Vss and operates in response to an inverted precharge signal PRECHb. The NMOS transistor NT2 is coupled between the node ND4 and a node ND5 and operates in response to a signal ec1. The NMOS transistor NT3 is coupled between the node ND5 and a node ND6 operates in response to a signal ev. The node ND4 is coupled to the first charge unit CI and the first dummy bit line BI, and the node ND5 is coupled to the second charge unit CH and the second dummy bit line BH. The node ND6 is coupled to the third charge unit CCS through the dummy bit lines BS1 to BSj.

Each of the sense amplifiers G1 to Gn has a similar construction. Accordingly, only the construction of the first sense amplifier G1 will be described as an example. The first sense amplifier G1 includes a plurality of NMOS transistors NB1 to NBj and NT4, and the comparator CO. The plurality of NMOS transistors NB1 to NBj and NT4 have one terminal coupled to the plurality of bit lines BG1 to BGj and the other terminal coupled to one node ND7. The NMOS transistor NT4 is coupled between the node ND7 and a common line CO3 and operates in response to the signal ev.

The comparator CO receives common reference voltages from the common lines CO1 to C03 that are coupled to the dummy bit lines BI, BH and BS1, compares the common reference voltages and a voltage of the node ND7, and generates an output signal OUT. The common lines CO1 and CO2 are coupled to two negative terminals of the comparator CO and apply the common reference voltage. Data transferred through the node ND7 are input into the positive terminal of the comparator CO. Accordingly, the output signal OUT is output as a comparison result of the common reference voltage and the data signal.

The operation of the low power ROM will be described below. When the signals ev1 and ev are enabled to a high level, the NMOS transistors NT2 and NT3 are turned on and apply the voltage Vdd to the nodes ND1 and ND2. When the precharge signal PRECHb is enabled, the NMOS transistor NT1 is turned on and initializes the node ND4 to a low level. If both the NMOS transistors NT2 and NT3 are turned on and an NMOS transistor of one of the bit lines BI, BH, and BS1 to BSj of a selected column is turned on, the charge units CI, CH, and CCS are charged to the power supply voltage Vdd. At this time, bit lines of other groups GC1 to GCn in the same column address are also charged to the potential of the node ND2.

The dummy bit lines BI, BH, and BS1 to BSj of the charge units CI, CH and CCS are coupled to the plurality of NMOS transistor DMI1 to DMSjk. The gate terminals of the plurality of transistors DMI1 to DMSjk are all coupled to the ground voltage Vss. Therefore, the plurality of transistors DMI1 to DMSjk are always kept turned off. Accordingly, the first sense amplifier G1 compares data received through the bit lines BG1 to BGj on the basis of the common reference voltage Vref and generates the output signal OUT.

As described above, in accordance with the low power ROM according to the present invention, the number of capacitors can be reduced with bit lines sharing the capacitors. Accordingly, the chip area can be reduced, power applied to the capacitors can be reduced, and power consumption can be saved.

While the invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A read-only memory (ROM) comprising:
a ROM core unit including a plurality of ROM core groups, each ROM core group including a plurality of transistors coupled to a plurality of word lines and a plurality of bit lines;
a word line decoder to select a desired word line from the word lines;
a column decoder to select a desired bit line from the bit lines;
one or more charge units, each charge unit having a plurality of transistors that are coupled to one of a plurality of dummy bit lines, wherein the dummy bit lines are selected by one of the bit lines, the plurality of transistors of each charge unit being deactivated;
a common reference voltage generator coupled to the dummy bit lines to generated a common reference voltage; and
a plurality of sense amplifiers, each coupled to a corresponding ROM core group and the common reference voltage generator,
wherein the common reference voltage generator generates the common reference voltage in response to a voltage charged through the dummy bit lines and transfers the generated common reference voltage to the sense amplifiers.

2. The ROM of claim 1, wherein gates of the transistors of the charge units are coupled to ground.

3. The ROM of claim 1, wherein the dummy bit lines includes first, second and third dummy bit lines,
wherein the one or more charge units includes first, second, and third charge units, and
wherein the first, second, and third dummy bit lines are coupled to the first, second and third charge units, respectively.

4. The ROM of claim 3, wherein the common reference voltage generator comprises:
a first switch unit to precharge the dummy bit lines in response to an inverted precharge signal;
a second switch unit to discharge the dummy bit lines in response to a precharge signal;
a third switch unit to connect the first and second dummy bit lines in response to a first control signal; and
a fourth switch unit to connect the second and third dummy bit lines in response to a second control signal.

5. The ROM of claim 4, wherein the first switch unit comprises:
first and second PMOS transistors, each being coupled to a power supply voltage and one of the dummy bit lines and is turned on in response to the inverted precharge signal.

6. The ROM of claim 4 wherein the second switch unit comprises an NMOS transistor that is coupled to the ground voltage and the first dummy bit line and is turned on in response to the precharge signal.

7. The ROM of claim 4, wherein the third switch unit comprises an NMOS transistor that is coupled to the first dummy bit line and the second dummy bit line, and is turned on in response to the first control signal, and
the fourth switch unit comprises an NMOS transistor that is coupled to the second dummy bit line and the third dummy bit line, and is turned on in response to the second control signal.

8. The ROM of claim 4, wherein the first, second and third charge units are part of the ROM core unit.

9. The ROM of claim 4, wherein each of the first, second and third charge units has substantially the same configuration as that of the ROM core group.

10. The ROM of claim 4, wherein the transistors of the first charge unit have gates and sources that are applied with a ground voltage and drains that are coupled to the first dummy bit line, the first charge unit having a capacitor to charge a voltage of the first dummy bit line.

11. The ROM of claim 4, wherein each of the plurality of sense amplifiers comprises:
first and second NMOS transistors having drains and sources, a drain of each NMOS transistor being coupled to a different bit line, the sources of the first and second NMOS transistors being coupled to a given node, wherein the NMOS transistors are operated according to an output of the column decoder;
a third NMOS transistor that is provided between the given node and the third dummy bit line and operates in response to a control signal; and
a comparator to compare the common reference voltage and a potential of the given node and to generate an output signal.

* * * * *